(12) United States Patent
Hatakeyama

(10) Patent No.: US 6,670,091 B1
(45) Date of Patent: Dec. 30, 2003

(54) PHOTOSENSITIVE TRANSFER MATERIAL

(75) Inventor: Akira Hatakeyama, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 10/404,545

(22) Filed: Apr. 2, 2003

(30) Foreign Application Priority Data

Apr. 9, 2002 (JP) ........................................ 2002-106712

(51) Int. Cl.[7] ................................................. G02B 5/20
(52) U.S. Cl. ........................... 430/263; 430/7; 430/259; 430/260; 430/262
(58) Field of Search ............................... 430/259, 260, 430/262, 263, 7

(56) References Cited

U.S. PATENT DOCUMENTS 5,294,516 A * 3/1994 Sato et al. .................. 430/262

FOREIGN PATENT DOCUMENTS

| JP | 05-173320 | | 7/1993 |
|---|---|---|---|
| JP | 8-122516 A | * | 5/1996 |
| JP | 10-115705 A | * | 5/1998 |
| JP | 11-149008 | | 6/1999 |
| JP | 11-338160 A | * | 12/1999 |

* cited by examiner

*Primary Examiner*—John A. McPherson
(74) *Attorney, Agent, or Firm*—Taiyo, Nakajima & Kato

(57) ABSTRACT

The present invention relates to a photosensitive transfer material comprising a temporary support and a thermoplastic resin layer, an alkali-soluble intermediate layer and an alkali-soluble photosensitive resin layer containing a pigment which layers are disposed in this order on the support, wherein the ratio (Em/Ep) of the elastic modulus Em of the intermediate layer to the elastic modulus Ep of the thermoplastic resin layer is in the range of 0.8 to 2.0.

20 Claims, No Drawings

PHOTOSENSITIVE TRANSFER MATERIAL

BACKGROUND OF THE INVENTION

1. Field of the Invention

The present invention relates to a photosensitive transfer material, and, particularly to a photosensitive transfer material preferable for transferring to an irregular surface of a substrate in a dry system.

2. Description of the Related Art

Photosensitive transfer materials for making liquid crystal cell color filters is known which are produced by forming a thermoplastic resin layer, an alkali-soluble intermediate layer and an alkali-soluble photosensitive resin layer containing a pigment in this order on a temporary support. Examples of the photosensitive transfer material are described in, for example, Japanese Patent Application Laid-Open (JP-A) Nos. 5-173320 and 11-149008.

In these photosensitive materials, a polyvinyl alcohol (PVA) is used as a binder for the intermediate layer from the viewpoint that it is preferable in the points of sensitivity and filming ability. On the other hand, although various polymers may be used for a binder of the thermoplastic resin layer, it is necessary to use a low elastic material as the binder to laminate the thermoplastic resin layer on a glass substrate.

When such a photosensitive recording material is cut in a processing step, there is a problem that the intermediate layer is broken at the cut portion, causing the generation of chips. Specifically, these chips are as small as about several $\mu$m. However, when these chips are stuck to the surface of the photosensitive transfer material which is the cut material, the stuck portion is not exposed to light in the case of carrying out exposure in the successive step for producing the color filter, causing pixel defects of the finally obtained color filter. Particularly, this pixel defect in recent precise color filters greatly deteriorates product quality and photosensitive transfer materials free from the generation of chips in a processing step are therefore desired.

SUMMARY OF THE INVENTION

It is an object of the present invention to solve the foregoing prior art problem and to provide a photosensitive material limited in the generation of chips during cutting in a processing step.

Specific means for solving the above object are as follows.

According to a first aspect of the invention, there is provided a photosensitive transfer material (I) comprising a temporary support and a thermoplastic resin layer, an alkali-soluble intermediate layer and an alkali-soluble photosensitive resin layer containing a pigment, the thermoplastic resin layer, the alkali-soluble intermediate layer and the alkali-soluble phososensitive resin layer being laminated in this order on the support, wherein a ratio (Em/Ep) of an elastic modulus Em of the intermediate layer to an elastic modulus Ep of the thermoplastic resin layer is in the range of 0.8 to 2.0.

According to a second aspect of the invention, there is provided a photosensitive transfer material (II) comprising a temporary support and a thermoplastic resin layer, an alkali-soluble intermediate layer and an alkali-soluble photosensitive resin layer containing a pigment which layers are disposed in this order on the support, wherein the ratio (Em/Ep) of the elastic modulus Em of the intermediate layer to the elastic modulus Ep of the thermoplastic resin layer is in the range of 0.8 to 1.5.

According to a third aspect of the invention, there is provided a photosensitive transfer material, wherein the intermediate layer of the photosensitive transfer material (I) contains a polyvinyl alcohol.

According to a fourth aspect of the invention, there is provided a photosensitive transfer material, wherein the intermediate layer of the photosensitive transfer material (II) contains a polyvinyl alcohol.

According to a fifth aspect of the invention, there is provided a photosensitive transfer material, wherein the intermediate layer of the photosensitive transfer material (I) contains a polymer latex.

According to a sixth aspect of the invention, there is provided a photosensitive transfer material, wherein the intermediate layer of the photosensitive transfer material (II) contains a polymer latex.

According to a seventh aspect of the invention, there is provided a photosensitive transfer material, wherein the intermediate layer of the photosensitive transfer material (I) contains a polyvinyl alcohol and a polymer latex.

According to an eighth aspect of the invention, there is provided a photosensitive transfer material, wherein the intermediate layer of the photosensitive transfer material (II) contains a polyvinyl alcohol and a polymer latex.

According to a ninth aspect of the invention, there is provided a photosensitive transfer material, wherein the intermediate layer of the photosensitive transfer material (I) contains a polymer latex and the polymer latex is a polymer latex (III) which is a polymer or a copolymer selected from the group consisting of acryl type, vinyl acetate type, rubber type, olefin type, polyester type, polyurethane type and polystyrene type polymers and copolymers thereof.

According to a tenth aspect of the invention, there is provided a photosensitive transfer material, wherein the intermediate layer of the photosensitive transfer material (II) contains a polymer latex (III).

According to an eleventh aspect of the invention, there is provided a photosensitive transfer material, wherein the intermediate layer of the photosensitive transfer material (I) contains a polyvinyl alcohol and a polymer latex (III).

According to an twelfth aspect of the invention, there is provided a photosensitive transfer material, wherein the intermediate layer of the photosensitive transfer material (II) contains a polyvinyl alcohol and a polymer latex (III).

According to a thirteenth aspect of the invention, there is provided a photosensitive transfer material, wherein the intermediate layer of the photosensitive transfer material (I) contains a polymer latex (III) and the polymer latex (III) has a glass transition temperature (Tg) of 60° C. or less.

According to a fourteenth aspect of the invention, there is provided a photosensitive transfer material, wherein the intermediate layer of the photosensitive transfer material (II) contains a polymer latex (III) and the polymer latex (III) has a glass transition temperature (Tg) of 60° C. or less.

According to a fifteenth aspect of the invention, there is provided a photosensitive transfer material, wherein the intermediate layer of the photosensitive transfer material (I) contains a polyvinyl alcohol and a polymer latex (III) and the polymer latex (III) has a glass transition temperature (Tg) of 60° C. or less.

According to a sixteenth aspect of the invention, there is provided a photosensitive transfer material, wherein the intermediate layer of the photosensitive transfer material (II) contains a polyvinyl alcohol and a polymer latex (III) and the polymer latex (III) has a glass transition temperature (Tg) of 60° C. or less.

According to a seventeenth aspect of the invention, there is provided a photosensitive transfer material, wherein the intermediate layer of the photosensitive transfer material (I) contains a polymer latex, and a content of said polymer latex is from 5 to 70% by mass based on a mass of the resin.

According to an eighteenth aspect of the invention, there is provided a photosensitive transfer material, wherein the intermediate layer of the photosensitive transfer material (II) contains a polymer latex, and a content of said polymer latex is from 5 to 70% by mass based on a mass of the resin.

According to a nineteenth aspect of the invention, there is provided a photosensitive transfer material, wherein the intermediate layer of the photosensitive transfer material (I) contains a polyvinyl alcohol and a polymer latex, and a content of said polymer latex is from 5 to 70% by mass based on a mass of the resin.

According to a nineteenth aspect of the invention, there is provided a photosensitive transfer material, wherein the intermediate layer of the photosensitive transfer material (II) contains a polyvinyl alcohol and a polymer latex, and a content of said polymer latex is from 5 to 70% by mass based on a mass of the resin.

DESCRIPTION OF THE PREFERRED EMBODIMENTS

A photosensitive transfer material according to the present invention will be hereinafter explained in detail.

The photosensitive transfer material of the invention has a structure in which a thermoplastic resin layer, an alkali-soluble intermediate layer and an alkali-soluble photosensitive resin layer containing a pigment are disposed in this order on a temporary support and may be provided with other layers if necessary.

In the photosensitive transfer material of the invention, particularly the ratio (Em/Ep) of the elastic modulus (Em) of the intermediate layer to that (Ep) of the thermoplastic resin layer which layers are disposed on the temporary support is designed to be 0.8 to 2.0. The elastic modulus meant here is a value measured under an atmosphere of 25° C./60% RH at a tensile rate of 100%/min. There are descriptions concerning the elastic modulus and a method of measuring it in, for example, "POLYMERIC MATERIAL ENCYCLOPEDIA" (KURIHARA Fukuji, published from The Nikkan Kogyo Shimbun, Ltd. (1999)).

The elastic modulus Ep of the thermoplastic resin layer is preferably as lower as about $3 \times 10^8$ dyne/$cm^3$ to laminate the photosensitive transfer material on a glass substrate. On the other hand, the intermediate layer is preferably provided with oxygen blocking ability. When the intermediate layer is structured using a polyvinyl alcohol (PVA) primarily to provide the oxygen blocking ability, the elastic modulus Em of the intermediate layer itself is $6 \times 10^8$ dyne/$cm^3$ or more. Therefore, the ratio Em/Ep of the elastic moduli of the both exceeds 2 in general.

As a method of decreasing the ratio Em/Ep, there is an idea of increasing the Ep. However, this method is one of the causes of the factors behind impaired lamination ability on a glass substrate. Preferably the ratio Em/Ep may be decreased using a method of decreasing the Em. As the method of decreasing the Em, a method is preferable in which a polymer latex is added to the intermediate layer. Although there is a method in which a plasticizer of PVA is added to the intermediate layer, on the other hand, this brings about not only reduced Em but also deteriorated oxygen blocking ability. Namely, the addition of a polymer latex is almost not accompanied by a reduction in the oxygen blocking ability of the intermediate layer but makes it possible to drop the elastic modulus with maintaining the function of an intermediate layer.

When the ratio Em/Ep of elastic moduli exceeds 2.0 in particular, this causes the intermediate layer to be broken to generate chips during cutting in a processing step. The ratio Em/Ep is preferably 0.8 or more in the point that each coating solution of the photosensitive resin layer and the intermediate layer is easily prepared. Among the aforementioned values of Em/Ep, a range of 0.8 to 1.5 is more preferable and a range of 1.0 to 1.2 is particularly preferable.

No particular limitation is imposed on the cutting method in the processing step.

Next, the details of the thermoplastic resin layer and alkali-soluble intermediate layer which satisfy the ratio of elastic moduli and the details of the alkali-soluble photosensitive resin layer having a pigment and the like will be explained.

Thermoplastic Resin Layer

The thermoplastic resin layer according to the invention is structured including at least one resin component.

Examples of the resin component may include an acryl resin, polystyrene resin, polyester, polyurethane, rubber type resin, vinyl acetate type resin, polyolefin type resin and copolymers of these materials.

Further, the resin constituting the thermoplastic resin layer is desirably soluble in an alkali though this is not essential. In this case, as the resin constituting the thermoplastic resin layer, at least one type may be arbitrarily selected from saponified products of ethylene/acrylate copolymers, saponified products of styrene/(meth)acrylate copolymers, styrene/(meth)acrylic acid/(meth)acrylate ternary copolymers, saponified products of vinyl toluene and (meth)acrylate copolymers, saponified products of (meth) acrylate copolymers of poly(meth)acrylates or butyl(meth) acrylates and vinyl acetates and compounds soluble in an aqueous alkali solution among organic polymers described in "PLASTIC PERFORMANCE HANDBOOK" (Japan Plastic Industries Association, edited by All Japan Plastic Molding Industries Association, published from Industry Research Association, Oct. 25, 1968).

These resins are preferably used as a mixture of a resin A and a resin B as described below.

Among the aforementioned resins, those selected from resins (hereinafter referred to as "resin A") having a weight average molecular weight ranging from 50,000 to 500,000 (glass transition temperature Tg=0 to 140° C.) and preferably 60,000 to 200,000 (Tg=30 to 110° C.) may be used.

Specific examples of the resin A include those which are soluble in an aqueous alkali solution and described in Japanese Patent Application Publication (JP-B) Nos. 54-34327, 55-38961, 58-12577 and 54-25957, JP-A No. 61-134756, JP-B No. 59-44615, JP-A Nos. 54-92723, 54-99418, 54-137085, 57-20732, 58-93046, 59-97135 and 60-159743, OLS No. 3504254, JP-A Nos. 60-247638, 60-208748, 60-214354, 60-230135, 60-258539, 61-169829, 61-213213, 63-147159, 63-213837, 63-266448, 64-55551, 64-55550, 2-191955, 2-199403, 2-199404 and 2-208602 and Japanese Patent Application No. 4-39653. Particularly preferable examples are methacrylic acid/2-ethylhexylacrylate/benzylmethacrylate/methylmethacrylate copolymers described in JP-A No. 63-147159.

Moreover, among the aforementioned various resins, those selected from resins (hereinafter referred to as "resin B") having a weight average molecular weight ranging from 3,000 to 30,000 (Tg=30 to 170° C.) and preferably 4,000 to 20,000 (Tg=60 to 140° C.) may be used. Preferable and specific examples of the resin B may be selected from those described in each specification (publication) and given as the specific examples of the above resin A. Styrene/(meth) acrylic acid copolymers described in JP-B No. 55-38961 and JP-A No. 5-241340 are particularly preferable.

If the resin A constituting the thermoplastic resin layer has a weight average molecular weight less than 50,000 or a Tg less than 0° C., there is the case where reticulation is generated and the thermoplastic resin bulges around during transfer so that it significantly contaminates a permanent support. Also, if the resin A has a weight average molecular weight exceeding 500,000 or a Tg exceeding 140° C., there is the case where air cells are involved between pixels during transfer and the ability of removing the thermoplastic resin using an aqueous alkali solution is significantly deteriorated. It is to be noted that the reticulation means that when the intermediate layer is expanded by causes such as moisture absorption, the soft thermoplastic resin layer is buckled, giving rise to fine "wrinkles" on the surface of the photosensitive transfer material, which causes transfer inferiors.

If the resin B constituting the thermoplastic resin layer has a weight average molecular weight less than 3,000 or a Tg less than 30° C., there is the case where reticulation is generated and the thermoplastic resin bulges around during transfer so that it significantly contaminates a permanent support. Also, if the resin B has a weight average molecular weight exceeding 30,000 or a Tg exceeding 170° C., air cells are involved between pixels during transfer and the ability of removing the thermoplastic resin using an aqueous alkali solution is significantly deteriorated.

As to the mixing ratio when mixing the resins A and B, the proportion occupied by the resin A in the total mixture mass is preferably 5 to 95% by mass. When the ratio of the resin A exceeds 95%, there is the case where air cells are easily involved between pixels during transfer, whereas when the ratio is less than 5%, there is the case where the thermoplastic resin bulges around and becomes fragile so that fine cutting chips tend to be scattered in a cutting step.

The Tg of the thermoplastic resin layer may be adjusted exactly by adding various polymers, supercooling materials, adherence improvers or surfactants and plasticizers such as releasing agents as well as above-mentioned resin with the intention of controlling the adhesiveness to the temporary support and/or transferability.

Preferable and specific examples of the plasticizer include a polypropylene glycol, polyethylene glycol, dioctyl phthalate, diheptyl phthalate, dibutyl phthalate, tricresyl phosphate, cresyldiphenyl phosphate, biphenyldiphenyl phosphate, polyethylene glycol mono(meth)acrylate, polyethylene glycol di(meth)acrylate, polypropylene glycol mono(meth)acrylate, polypropylene glycol di(meth) acrylate, addition reaction products of epoxy resins and polyethylene glycol mono(meth)acrylates, addition reaction products of organic diisocyanates and polyethylene glycol mono(meth)acrylates, addition reaction products of organic diisocyanates and polypropylene glycol mono(meth) acrylates and condensed reaction products of bisphenol A and polyethylene glycol mono(meth)acrylates.

The amount of the aforementioned plasticizer to be added is preferably 0 to 200% by mass and more preferably 20 to 100% by mass based on the total amount of the resins A and B constituting the thermoplastic resin layer.

The layer thickness of the thermoplastic resin layer is preferably 6 μm or more. This reason is that if the layer thickness of the thermoplastic resin is less than 6 μm, the irregularities more than 1 μm on the background can be absorbed incompletely. Also, the upper limit of the layer thickness is about 100 μm or less and preferably about 50 μm or less from the viewpoint of removability using an aqueous alkali solution and of a production aptitude.

A solvent is usually used when preparing a coating solution for the formation of the thermoplastic resin layer. As the solution, any solvent may be used without any limitation as far as it solves the resin constituting this layer. Examples of the solvent include methyl ethyl ketone, n-propanol and i-propanol.

Intermediate Layer

The intermediate layer according to the invention is alkali-soluble and is constituted by containing at least an alkali-soluble resin.

No particular limitation is imposed on the resin constituting the intermediate layer as far as it is alkali-soluble. Examples of the resin may include polyvinyl alcohol type resins, polyvinyl pyrrolidone type resins, cellulose type resins, acrylamide type resins, polyethylene oxide type resins, gelatins, vinyl ether type resins, polyamide resins and copolymers of these resins.

Resins which are made to be alkali-soluble by copolymerizing a monomer having a carboxyl group or a sulfonic acid group with a resin such as a polyester which is usually an alkali-insoluble may also be used.

Among these compounds, polyvinyl alcohols (PVA) are preferable. Among these polyvinyl alcohols, those having a saponification degree of 80% or more are preferable and those having a saponification degrees of 83 to 98% are more preferable.

As the resin constituting the intermediate layer, two or more types are preferably used by mixing them. Particularly, a polyvinyl alcohol and a polyvinyl pyrrolidone are preferably used by mixing them. The mass ratio of the both (polyvinyl pyrrolidone/polyvinyl alcohol) when the both are mixed is preferably 1/99 to 75/25 and more preferably 10/90 to 50/50. If this ratio is less than 1/99, there is the case where this brings about deteriorated surface condition of the intermediate layer and further adherence inferiors to the photosensitive resin layer which is to be applied thereto and is explained later, whereas if the ratio exceeds 75/25, there is the case where the oxygen blocking ability of the intermediate layer is deteriorated, leading to reduced sensitivity.

It is preferable to add a polymer latex to the intermediate layer from the viewpoint of efficiently controlling the ratio (Em/Ep) of the elastic modulus (Em) of the intermediate layer to the elastic modulus (Ep) of the thermoplastic resin layer as mentioned above. The polymer latex meant here is those in which fine particles of a water-insoluble polymer are dispersed in water. There are descriptions concerning the polymer latex in, for example, "CHEMICAL OF POLYMER LATEX" (MUROI Soichi, published from Kobunshi Kankokai (1973)).

As the polymer latex preferably used in the invention, polymers such as acryl types, vinyl acetate types, rubber types (e.g., styrene-butadiene types and chloroprene types), olefin types, polyester types, polyurethane types and polystyrene types and copolymers of these types are preferable. Among these compounds, particularly those having a glass transition temperature (Tg) of 60° C. or less are preferable and those having a glass transition temperature of 45° C. or less are more preferable. If the Tg of a polymer latex exceeds 60° C., there is the case where the effect of preventing reticulation is too small.

Preferable examples of the polymer latex include an ethylacrylate latex (average particle diameter: 0.2 μm), ethylacrylate/acrylic acid (98/2) latex (average particle diameter: 0.2 μm), methylmethacrylate/ethylacrylate/acrylic acid (55/40/5) latex (average particle diameter: 0.15 μm), methylmethacrylate/ethylacrylate/acrylic acid (65/30/5) latex (average particle diameter: 0.19 μm), methylmethacrylate/ethylacrylate/acrylic acid (75/20/5) latex (average particle diameter: 0.15 μm), methylmethacrylate/ethylacrylate/acrylic acid (30/65/5) latex (average particle diameter: 0.15 μm), methylmethacrylate/2-ethylhexylacrylate/methacrylic acid (50/47/3) latex (average particle diameter: 0.15 μm) and styrene/butadiene/acrylic acid (40/58/2) latex (average particle diameter: 0.15 μm). The copolymerization ratio of each polymer latex represents mass ratio.

The content of the above polymer latex in the intermediate layer is preferably 5 to 70% by mass and more preferably 10 to 50% by mass of the resin (mass) constituting the foregoing intermediate layer. If the content is less than 5% by mass, there is the case where the effect of preventing reticulation is insufficient, whereas if the content exceeds 70% by mass, there is the case where the surface condition of the intermediate layer is impaired.

Additives such as a surfactant may be added to the intermediate layer if necessary. The content of the surfactant is preferably 0.01 to 10% by mass.

The layer thickness of the intermediate layer is preferably 0.1 to 5 μm and more preferably 0.5 to 3 μm. When the layer thickness is less than 0.1 μm, this occasionally brings about a reduction in oxygen blocking ability, whereas when the content exceeds 5 μm, there is the case where the time required for removing the intermediate layer during developing is prolonged.

When preparing a coating solution for forming the intermediate layer, a solvent is used in usual. As the solvent, any solvent may be used without any particular limitation as far as it can dissolve the resin constituting the intermediate layer and particularly water is preferable. A mixture solvent obtained by mixing water with a water-miscible solvent as will be explained later is also preferable. Preferable and specific examples of the solvent include, besides water, water/methanol (90/10), water/methanol (70/30), water/methanol (55/45), water/ethanol (70/30), water/1-propanol (70/30), water/acetone (90/10) and water/methyl ethyl ketone (95/5) (the above ratios represent mass ratios).

In the invention, the term "alkali-soluble" means that a subject material is soluble in an aqueous solution of the following alkali materials or in the aqueous solution mixed with a water-miscible organic solvent. This is the same to the photosensitive resin layer which will be explained later.

Examples of the alkaline material include alkali metal hydroxides (e.g., sodium hydroxide and potassium hydroxide), alkali metal carbonates (e.g., sodium carbonate and potassium carbonate), alkali metal bicarbonates (e.g., sodium bicarbonate and potassium bicarbonate), alkali metal silicates (e.g., sodium silicate and potassium silicate), alkali metal methasilicates (e.g., sodium methasilicate and potassium methasilicate), triethanolamine, diethanolamine, monoethanolamine, morpholine, tetraalkylammonium hydroxides (e.g., tetramethylammonium hydroxide) and trisodium phosphate. The concentration of the alkaline material when it is in the state of an aqueous solution is 0.01 to 30% by mass and the pH of the aqueous solution is preferably 8 to 14.

Examples of proper organic solvents miscible with water include methanol, ethanol, 2-propanol, 1-propanol, butanol, diacetone alcohol, ethylene glycol monomethyl ether, ethylene glycol monoethyl ether, ethylene glycol mono-n-butyl ether, benzyl alcohol, acetone, methyl ethyl ketone, cyclohexanone, ε-caprolactone, γ-butyrolactone, dimethylformamide, dimethylacetamide, hexamethylphosphoramide, ethyl butyrate, methyl butyrate, ε-caprolactam and N-methylpyrrolidone. The concentration of the organic solvent miscible with water is 0.1 to 30% by mass.

Photosensitive Resin Layer

The photosensitive resin layer according to the invention is a layer which is soluble in an alkali and contains at least a pigment. The layer may contain a photopolymerizable composition as a resin component constituting the photosensitive resin layer besides a pigment.

Preferable examples of the photopolymerizable composition are described in JP-A No. 5-34517. The "resin component" meant here includes those which are monomers or oligomers and are polymerized into a resin after exposed to light.

Also, examples of preferable type, size and the like of the foregoing pigment are described in JP-A No. 11-149008.

Additives such as surfactants may be contained in the photosensitive resin layer if necessary. Also, in the case of preparing a coating solution for forming the thermoplastic resin layer, a solvent is usually used. As the solvent, any solvent may be used without any particular limitation as far as it solves the resin constituting this layer. Examples of the solvent include methyl ethyl ketone, n-propanol and i-propanol.

It is desirable to form a thin covering sheet on the photosensitive resin layer to protect the photosensitive resin layer from being contaminated and damaged during storing. The covering sheet may be made of the same material as or similar material to that of the temporary support. It is however preferable to select a material peelable from the photosensitive resin layer easily. Proper materials of the covering sheet are silicone paper, polyolefin sheets, polytetrafluoroethylene sheets and the like.

The thickness of the covering sheet is preferably about 5 to 100 μm. A polyethylene or polypropylene film (sheet) having a thickness of 10 to 30 μm is particularly preferable.

Temporary Support

A known support made of, for example, a polyester, polystyrene or the like may be used as the temporary support constituting the photosensitive transfer material. Among these materials, a biaxially stretched polyethylene terephthalate is preferable in view of cost, heat resistance and dimensional stability.

Also, the temporary support may be provided with a conductive layer as described in JP-A No. 11-149008 if necessary.

The thickness of the temporary support is preferably about 15 to 200 μm and more preferably 30 to 150 μm. When the thickness is less than 15 μm, there is the case where galvanized sheet steel-like wrinkles are caused by heat in a lamination step, whereas when the thickness exceeds 200 μm, there is the case where this is costly disadvantageous.

Next, an image formation method using the photosensitive transfer material of the invention will be explained.

First, when the photosensitive transfer material is provided with the covering sheet, this covering sheet is removed and then the bared surface of the photosensitive resin layer is laminated on a substrate under pressure and heating. For the lamination, a conventionally known laminator or vacuum laminator may be used. An auto-cut laminator may be used to more improve productivity. After that, the temporary support is peeled off and a predetermined mask is located above the exposed thermoplastic resin layer. Then, the photosensitive transfer material is exposed to light from above the mask through the mask, the thermoplastic resin layer and the intermediate layer, followed by developing. The developing may be carried out using a solvent or an aqueous developing solution, particularly an aqueous alkali solution according to a known method, for example, by dipping, spraying using a spray or rubbing using a brush or, dipping or spraying with applying ultrasonic wave.

This operation is repeated plurally by using plural photosensitive transfer materials provided respectively with a photosensitive resin layer colored in a different color, whereby a multicolor image can be formed.

The photosensitive transfer material of the invention may be applied to the production of multicolor images and printed circuit boards as well as the production liquid displays and color filters and the production of a protective layer of color filters as major uses.

In the production of printed circuit boards, a known copper-foiled laminate plate is used as a substrate and in the production of color filters, a known glass plate or a soda glass on which surface a silicon oxide film is formed or the like is used as a substrate.

According to the photosensitive transfer material of the invention, no air cell is intermingled in the periphery of precedent pixels which have been already formed, no dislocation of lamination arises and at the same time, the generation of chips along with the breakage of the intermediate layer is suppressed even in the case of laminating at a high speed when producing a printed board and color filters as mentioned above. Therefore, for example, printed circuit boards and color filters having pretty surface conditions can be obtained.

EXAMPLES

The present invention will be explained in more detail by way of examples, which are not intended to be limiting of the invention, in which the term "parts" is based on mass, unless otherwise noted.

Example 1

(1) Production of a Photosensitive Transfer Material

Formation of a Thermoplastic Resin Layer

The following components were mixed to prepare a coating solution for a thermoplastic resin layer. This coating solution for a thermoplastic resin layer was applied to one surface of a biaxially stretched polyethylene terephthalate support (temporary support) 75 μm in thickness. Then, the coating film was dried at 100° C. for 2 minutes to form a thermoplastic resin layer 15 μm in layer thickness.

Composition of the Thermoplastic Resin Layer Coating Solution

| | |
|---|---|
| Methylmethacrylate/2-ethylhexylacrylate/benzylmethacrylate/ methacrylic acid (55/30/10/5 (mol ratio)) copolymer (weight average molecular weight = 100,000) | 60 g |
| Styrene/acrylic acid (65/35 (mol ratio)) copolymer (weight average molecular weight = 10,000) | 140 g |
| Compound obtained by reacting bisphenol A with two equivalents of octaethylene glycol monomethacrylate by dehydration condensation (BPE-500, manufactured by Shin-Nakamura Chemical Co., Ltd.) | 150 g |
| Fluorine type surfactant (Megafack F176PF, manufactured by Dainippon InK and Chemicals, Inc.) | 1 g |
| Methyl ethyl ketone | 699 g |

Formation of an Intermediate Layer

In succession, the following components were mixed to prepare an intermediate layer coating solution, which was then applied to the surface of the thermoplastic resin layer on the temporary support on which the thermoplastic resin layer had been formed by application. Then, the coating film was dried at 100° C. for 2 minutes to form an intermediate layer 2 μm in layer thickness.

Composition of the Intermediate Layer Coating Solution

| | |
|---|---|
| Polyvinyl alcohol (PVA) (PVA205, degree of saponification: 80%, manufactured by Kuraray Co., Ltd.) | 30 g |
| Polyvinylpyrrolidone (PVP) (PVP-K90, manufactured by GAF Corporation) | 10 g |
| Ethylacrylate latex Lx-1 (the amount to be added is shown in Table 2 below. The "%" in the table indicates the mass ratio (mass %) of (Lx-1)/(Lx-1 + PVA + PVP) (polymer latex: average particle diameter: 0.18 μm, solid concentration: 20% and glass transition temperature: −24°C.) | |
| Methanol | 455 g |
| Distilled water (added to be 1000 g in total) | |

Formation of a Photosensitive Resin Layer

A red, a green, a blue (see the following Table 1, unit: parts) and a black photosensitive resin layer coating solution comprising following each formulation were prepared. Four temporary supports provided with a thermoplastic resin layer and an intermediate layer were produced in the same manner as above. Each of the photosensitive resin layer coating solutions was further applied to the surface of each intermediate layer and then dried at 100° C. for 2 minutes. Each layer thickness of the photosensitive resin layers was designed to be 2.3 μm in the case of the red, the blue and the green photosensitive resin layer and 1.6 μm in the case of the black photosensitive resin layer.

TABLE 1

| | Red | Green | Blue |
|---|---|---|---|
| Benzylmethacrylate/methacrylic copolymer (mol ratio = 73/27, molecular weight: 30,000) | 60 | 33.5 | 34.1 |
| Pentaerythritol hexaacrylate | 28.4 | 25.2 | 32.3 |
| Fluorine type surfactant (Dainippon Ink and Chemicals, Inc.) | 0.37 | 0.19 | 0.30 |
| 2,4-Bis(trichloromethyl)-6-[4-(N,N-diethoxycarbonylmethyl)]-8-triazine | 1.31 | 0 | 1.52 |
| 2-Trichloromethyl-5-(p-styrylstyryl)-1,3,4-oxadiazole | 0 | 1.2 | 0 |
| Phenothiazine | 0.02 | 0.020 | 0.026 |
| Chromophthal Red A2B (red) | 27 | 0 | 0 |
| Paleotol Yellow L1820 | 10.3 | 23.0 | 0 |
| Heliogen Blue L6700F (blue) | 0 | 0 | 25.6 |
| Monastral Green (green) | 0 | 23.0 | 0 |
| Methoxypropylene glycol acetate | 310 | 310 | 310 |
| Methyl ethyl ketone | 460 | 460 | 460 |

Composition of a Black Photosensitive Resin Layer Coating Solution

| | |
|---|---|
| Benzylmethacrylate/methacrylic acid copolymer (=70/30 (mol ratio)) (acid value = 104 mg KOH/g, weight average molecular weight = 30,000) | 21.0 parts |
| 2 Ethylhexylacrylate/methacrylic acid/ methylmethacrylate/benzylmethacrylate copolymer (=7/15/73/5 (mol ratio)) (acid value = 77 mg KOH/g, weight average molecular weight = 80,000) | 14.7 parts |
| Dipentaerythritol hexaacrylate | 26.8 parts |
| 2,4-bis(trichloromethyl)-6-[4-(N,N-diethoxy-carbomethyl)-3-bromophenyl]-s-triazine | 1.32 parts |
| Carbon black | 27.0 parts |
| Pigment Blue 15:6 | 5.70 parts |
| Pigment Violet 23 | 3.57 parts |
| Hydroquinone monomethyl ether | 0.02 parts |
| F177P (surfactant, Dainippon Ink and Chemicals Inc.) | 0.09 parts |
| Propylene glycol monomethyl ether acetate | 400 parts |
| Methyl ethyl ketone | 600 parts |

In succession, a polypropylene sheet (covering sheet) 15 μm in thickness was overlapped on and bonded under pressure to each of the formed red, blue, green and black photosensitive resin layers at ambient temperature to obtain four color (red, blue, green and black) photosensitive transfer materials according to the invention.

Evaluation (1) Calculation of the Ratio of Elastic Modulus

The intermediate coating solution prepared above was applied to the surface of a polyethylene terephthalate sheet and dried at 100° C. for 5 minutes to form an intermediate layer model film 5 μm in thickness. This model film was cut down to a size of 20 mm×5 mm to prepare a sample, which was then subjected to a tensile test using a Tensilone RTM-100 (manufactured by Orientic) to calculate the elastic modulus (Em) of the intermediate layer model film. The conditions of the tensile test are as follows. It is to be noted that a method of calculating the elastic modulus conformed to the aforementioned "POLYMERIC MATERIAL ENCYCLOPEDIA".

Environmental temperature and humidity: 25° C./60% RH

Tensile speed: 20 mm/min (100%/min)

Also, a thermoplastic resin layer model film was formed using the thermoplastic resin layer coating solution prepared above in the same manner as above except that a Teflon (R) sheet was used in place of the used polyethylene terephthalate sheet to calculate the elastic modulus (Ep) of the thermoplastic resin layer model film. Then, the ratio Em/Ep was found from the calculated elastic moduli Em and Ep. The results are shown in Table 2 shown below.

(2) Evaluation of the Generation of Chips

Using the sample obtained in the above "(1) Calculation of the ratio of elastic modulus", it was cut by a hand cutter under an atmosphere of 25° C./60% RH to observe the section using an optical microscope at a magnification of 200, thereby observing generated cracks. The level of the cracks was evaluated according to the following standard. Practically, ○ and ○Δ are classified into the allowable level. The results are shown in Table 2 below.

Standard

○: Generation of cracks were not observed at all.
○Δ: 10 or less cracks per 1 mm of the sample were observed.
Δ: 10 to 50 cracks per 1 mm of the sample were observed.
X: 50 or more cracks per 1 mm of the sample were observed.

Also, the obtained four color (red, blue, green and black) photosensitive transfer materials of the invention were cut in the same manner as above to confirm the level of cracks.

Also, using the four color photosensitive transfer materials obtained above, first the polypropylene sheet was removed from the red photosensitive transfer material and the photosensitive resin layer was laminated on a glass substrate under pressure and heating by using a vacuum laminator in the condition that the bared surface of the photosensitive resin layer was applied to the glass substrate. Then, the temporary support was peeled off and the thermoplastic resin layer was exposed to a pattern of light from an extra-high pressure mercury lamp through an interposed exposure mask for a red color which mask was located above the thermoplastic resin layer. After the exposure was finished, the photosensitive resin layer was developed using a developing agent to obtain a red pattern. This operation was repeated for other three color photosensitive transfer materials to form a multicolor filter.

Examples 2 to 8

Four color (red, blue, green and black) photosensitive transfer materials according to the invention were produced in the same manner as in Example 1 except that an ethylacrylate/acrylic acid (=98/2 (mass ratio)) latex Lx-2 (average particle diameter: 0.2 μm, solid concentration: 20% and glass transition temperature: −22° C.), a styrene/butadiene/acrylic acid (=40/58/2 (mass ratio)) latex Lx-3 (average particle diameter: 0.15 μm, solid concentration: 35% and glass transition temperature: −32° C.), a methylmethacrylate/ethylacrylate/acrylic acid (=55/40/5 (mass ratio)) latex Lx-4 (average particle diameter: 0.15 μm, solid concentration: 25% and glass transition temperature: 40° C.), a methylmethacrylate/ethylacrylate/acrylic acid (=65/30/5 (mass ratio)) latex Lx-5 (average particle diameter: 0.19 μm, solid concentration: 23% and glass transition temperature: 53° C.), a methylmethacrylate/ethylacrylate/acrylic acid (=75/20/5 (mass ratio)) latex Lx-6 (average particle diameter: 0.15 μm, solid concentration: 22% and glass transition temperature: 69° C.), a commercially available acryl latex (Hydran WLS202, manufactured by Dainippon Ink and Chemicals Inc., 35%) and a commercially available acryl latex (Boncoat SFA-33, manufactured by Dainippon Ink and Chemicals Inc., 45%) (these latexes are all polymer latexes) were respectively used in place of the ethylacrylate latex Lx-1 used for the preparation of the intermediate layer coating solution in Example 1. These photosensitive transfer materials were evaluated in the same manner as above. In Example 2, a color filter was also produced in the same manner as in Example 1. The results are shown in Table 2 below.

Comparative Example 1

Comparative four color (red, blue, green and black) photosensitive materials were produced in the same manner as in Example 1 except that the ethylacrylate latex Lx-1 used for the preparation of the intermediate layer coating solution was not added and evaluated in the same manner as above. The results are shown in Table 2.

TABLE 2

| | Latex | | Elastic modulus of the intermediate layer Em | Elastic modulus of the thermoplastic resin layer Ep | Em/Ep | Evaluation of generation of chips |
|---|---|---|---|---|---|---|
| | Type | Amount to be added [%] *3 | | | | |
| Example 1 | Lx-1 | 20 | 3.1 | 3.0 | 1.03 | ○ Δ |
| Example 2 | Lx-2 | 20 | 3.1 | 3.0 | 1.03 | ○ Δ |
| Example 3 | Lx-3 | 20 | 3.2 | 3.0 | 1.07 | ○ Δ |
| Example 4 | Lx-4 | 20 | 3.1 | 3.0 | 1.03 | ○ Δ |
| Example 5 | Lx-5 | 15 | 3.2 | 3.0 | 1.07 | ○ Δ |
| Example 6 | Lx-6 | 25 | 3.3 | 3.0 | 1.1 | ○ Δ |
| Example 7 | Hydran*1 | 20 | 3.4 | 3.0 | 1.13 | ○ Δ |
| Example 8 | Boncoat*2 | 20 | 3.1 | 3.0 | 1.03 | ○ Δ |
| Comparative Example 1 | — | — | 7.3 | 3.0 | 2.43 | X |

*1Acryl latex (Hydran WLS202, manufactured by Dainippon Ink and Chemicals Inc.)
*2Acryl latex (Boncoat SFA-33, manufactured by Dainippon Ink and Chemicals Inc.)
*3 "%" shows the mass ratio (mass %) of (latex)/(latex + PVA + PVP).

From the results of the above Table 2, the generation of cracks caused by cutting was greatly suppressed in Examples 1 to 8 in which the ratio Em/Ep of the elastic modulus of the intermediate layer to that of the thermoplastic resin layer was made to be around 1. Therefore, in the case of evaluating the photosensitive transfer material, obtained in each example, by cutting, the generation of cracks which were a cause of chips could be likewise restrained. In the meantime, when color filters were produced using the photosensitive materials obtained in Examples 1 and 2, the both were free from, for example, generation of coating unevenness and lamination unevenness and therefore a pattern of good image quality could be obtained.

On the other hand, in Comparative example in which the ratio Em/Ep of the elastic moduli was 2 or more, many cracks arose during cutting.

The invention can provide a photosensitive transfer material limited in generation of chips during cutting in a processing step.

What is claimed is:

1. A photosensitive transfer material comprising a temporary support and a thermoplastic resin layer, an alkali-soluble intermediate layer and an alkali-soluble photosensitive resin layer containing a pigment, the thermoplastic resin layer, the alkali-soluble intermediate layer and the alkali-soluble photosensitive resin layer being laminated in this order on the temporary support, wherein a ratio (Em/Ep) of an elastic modulus Em of the intermediate layer to an elastic modulus Ep of the thermoplastic resin layer is in a range from 0.8 to 2.0.

2. A photosensitive transfer material according to claim 1, wherein the ratio (Em/Ep) is in a range from 0.8 to 1.5.

3. A photosensitive transfer material according to claim 1, wherein the intermediate layer comprises polyvinyl alcohol.

4. A photosensitive transfer material according to claim 2, wherein the intermediate layer comprises polyvinyl alcohol.

5. A photosensitive transfer material according to claim 1, wherein the intermediate layer comprises polymer latex.

6. A photosensitive transfer material according to claim 2, wherein the intermediate layer comprises polymer latex.

7. A photosensitive transfer material according to claim 3, wherein the intermediate layer comprises polymer latex.

8. A photosensitive transfer material according to claim 4, wherein the intermediate layer comprises polymer latex.

9. A photosensitive transfer material according to claim 5, wherein the polymer latex is a polymer or a copolymer selected from the group consisting of acryl type, vinyl acetate type, rubber type, olefin type, polyester type, polyurethane type and polystyrene type polymers and copolymers thereof.

10. A photosensitive transfer material according to claim 6, wherein the polymer latex is a polymer or a copolymer selected from the group consisting of acryl type, vinyl acetate type, rubber type, olefin type, polyester type, polyurethane type and polystyrene type polymers and copolymers thereof.

11. A photosensitive transfer material according to claim 7, wherein the polymer latex is a polymer or a copolymer selected from the group consisting of acryl type, vinyl acetate type, rubber type, olefin type, polyester type, polyurethane type and polystyrene type polymers and copolymers thereof.

12. A photosensitive transfer material according to claim 8, wherein the polymer latex is a polymer or a copolymer selected from the group consisting of acryl type, vinyl acetate type, rubber type, olefin type, polyester type, polyurethane type and polystyrene type polymers and copolymers thereof.

13. A photosensitive transfer material according to claim 9, wherein the polymer latex has a glass transition temperature (Tg) of 60° C. or less.

14. A photosensitive transfer material according to claim 10, wherein the polymer latex has a glass transition temperature (Tg) of 60° C. or less.

15. A photosensitive transfer material according to claim 11, wherein the polymer latex has a glass transition temperature (Tg) of 60° C. or less.

16. A photosensitive transfer material according to claim 12, wherein the polymer latex has a glass transition temperature (Tg) of 60° C. or less.

17. A photosensitive transfer material according to claim 5, wherein a content of the polymer latex is from 5 to 70% by mass based on a mass of a resin constituting the intermediate layer.

18. A photosensitive transfer material according to claim 6, wherein a content of the polymer latex is from 5 to 70% by mass based on a mass of a resin constituting the intermediate layer.

19. A photosensitive transfer material according to claim 7, wherein a content of the polymer latex is from 5 to 70% by mass based on a mass of the resin constituting the intermediate layer.

20. A photosensitive transfer material according to claim 8, wherein a content of the polymer latex is from 5 to 70% by mass based on a mass of the resin constituting the intermediate layer.

* * * * *